United States Patent [19]
Fan et al.

[11] Patent Number: 5,747,169
[45] Date of Patent: May 5, 1998

[54] FIELD-ASSISTED SEALING

[75] Inventors: Zhong Hui-Hugh Fan, Plainsboro; Aaron William Levine, Lawrenceville; Satyam Choudary Cherukuri; Steven A. Lipp, both of Cranbury, all of N.J.

[73] Assignee: David Sarnoff Research Center, Inc., Princeton, N.J.

[21] Appl. No.: 745,766

[22] Filed: Nov. 8, 1996

[51] Int. Cl.[6] .................................................. B32B 9/00
[52] U.S. Cl. .......................... 428/426; 65/33.4; 65/40; 65/42; 65/43
[58] Field of Search .................... 65/33.4, 40, 42, 65/43; 428/426

[56] References Cited

U.S. PATENT DOCUMENTS

| | | | |
|---|---|---|---|
| 2,620,598 | 12/1952 | Jobling-Purser et al. | 49/82 |
| 3,417,459 | 12/1968 | Pomerantz et al. | 29/472.9 |
| 3,506,424 | 4/1970 | Pomerantz | 65/40 |
| 4,294,602 | 10/1981 | Horne | 65/40 |
| 4,452,624 | 6/1984 | Wohltjen et al. | 65/40 |
| 4,643,532 | 2/1987 | Kleiman | 350/343 |
| 5,009,690 | 4/1991 | Curlee et al. | 65/40 |

Primary Examiner—Terressa M. Mosley
Attorney, Agent, or Firm—William J. Burke

[57] ABSTRACT

The invention provides a method of bonding a glass substrate and a nonconductive substrate comprising the steps of: (a) contacting a surface of the nonconductive substrate which is coated with a field-assist bonding material with a conforming surface of the glass substrate; and (b) applying sufficient heat to the two substrates and sufficient voltage across the two substrates to bond the two substrates together.

22 Claims, 3 Drawing Sheets

FIELD-ASSISTED SEALING

This non-provisional U.S. national application, filed under 35 U.S.C. 111(a) claims, under 35 U.S.C. 119(e)(1), the benefit of the filing date of provisional U.S. application Ser. No. 60/006,588 filed on Nov. 9, 1995 under 35 U.S.C. 111(b).

This application relates to a method of bonding glass substrates to other nonconductive substrates, and to the bonded products thereof.

The invention has its genesis in attempts to solve the problem of bonding glass plates on which microstructures, such as channels for conveying fluids, which channels have widths, for instance, between about 50 and about 300 μm or between about 50 and about 150 μm, and similarly scaled depths, have been fabricated. A method that well preserved such structures was sought. Field-assisted thermal bonding was initially rejected as an option because this method has never been satisfactorily applied to a nonconductive material such as glass. However, the present inventors have discovered parameters that allow hermetic sealing between glass plates using this methodology.

It will, of course, be recognized that the invention has broad applicability and is not limited to the particular problem that gave rise to the invention. For instance, it can be used in the manufacture of (i) sensors (including both physical and chemical sensors), (ii) micropumps and microvalves, (3) microelectric mechanical systems, and (iv) miniaturized diagnostic or other analytic devices.

SUMMARY OF THE INVENTION

The invention provides method of bonding a glass substrate and a nonconductive substrate comprising the steps of: (a) contacting a surface of the nonconductive substrate which is coated with a field-assist bonding material with a conforming surface of the glass substrate; and (b) applying sufficient heat to the two substrates and sufficient voltage across the two substrates to bond the two substrates together.

DEFINITIONS

Figure 1:
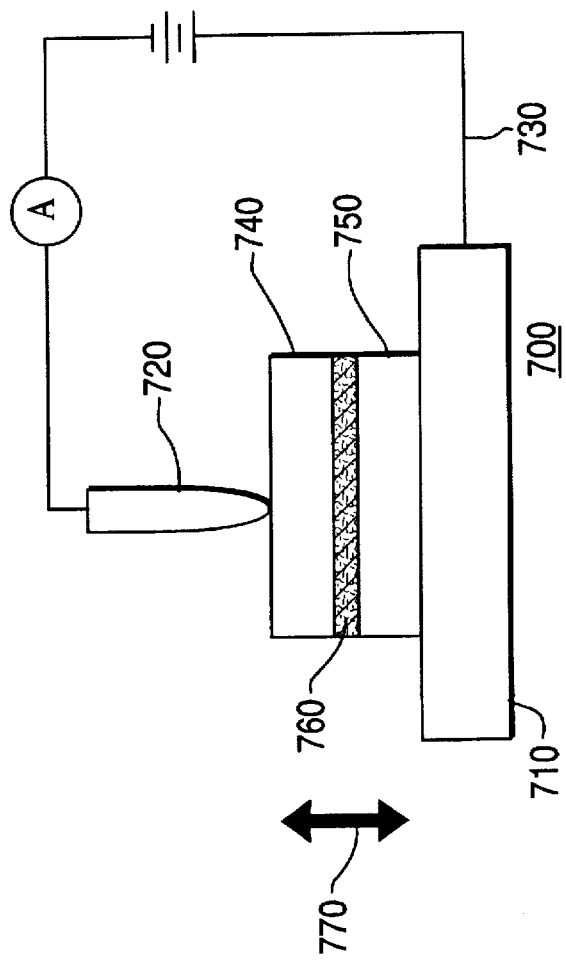
FIG. 1 shows a device for conducting field-assisted bonding of glass substrates.

The following terms shall have the meaning set forth below:

annealing temperature: the temperature at which the internal stress in a glass begins to be substantially reduced.

capillary dimensions: dimensions that favor capillary flow of a liquid. Typically, channels of capillary dimensions are no wider than about 1.5 mm. Preferably channels are no wider than about 500 μm, yet more preferably no wider than about 250 μm, still more preferably no wider than about 150 μm.

glass: any of a number of materials commonly referred to as "glass" that contain a silicon oxide structure.

hole diameter: because techniques for fabricating small holes often create holes that are wider at one end than the other (for instance, about 50 μm wider), the hole diameter values recited to herein refer to the narrowest diameter.

horizontal, vertical, EW, NS: indications of the orientation of a part of the distribution system refer to the orientation when the device is in use. The notations "EW axis" and "NS axis" are in reference to FIGS. 3 and 4, where an EW axis goes from right to left and is perpendicular to the long axis of the page and a NS axis is from top to bottom parallel to the long axis of the page.

nonconductive substrate: made of a material having an electrical resistance that is at least about as high as such traditional insulators as one of glass or ceramics. Silicon is not a nonconductive substrate.

perpendicular: channels in the distribution plate are perpendicular even if primarily located on separate horizontal planes if their vertical projections onto the same horizontal plane are perpendicular.

reservoir: unless a different meaning is apparent from the context, the terms "reservoir" and "fluid reservoir" include the horizontal extension channels (sometimes simply termed "extensions") directly connected to the reservoir or fluid reservoir.

DETAILED DESCRIPTION

A. Bonding Substrates

The method of the invention of permanently joining glass substrates uses a field-assisted thermal bonding process. It has now been discovered that glass-glass sealing using field-assisted thermal bonding is possible despite the low conductivity of glass if a field-assist bonding material is interposed between the substrates to be bonded.

To the top or bottom surface of one glass substrate, a layer of a field-assist bonding material is applied. Preferably, the field-assist bonding material layer has a thickness from about 50 nm to about 1,000 nm, more preferably from about 150 nm to about 500 nm, still more preferably from about 150 nm to about 250 nm, more preferably the field-assist bonding material layer has a thickness no more than about 400 nm. The field-assist bonding material can be a material capable of bonding a glass substrate to another substrate using the method of the invention. Preferably, the field-assist bonding material is capable of forming covalent bonds with silicon oxide. Preferably, the field-assist bonding material is nonconductive. Preferably, the field-assist bonding material is non-doped silicon or silica. More preferably, the field-assist bonding material is non-doped silicon.

The field-assist bonding material can be applied to a nonconductive substrate, for instance, by electron beam evaporation (where electrons bombard a source material to vaporize atoms that are then condensed on a substrate), chemical vapor deposition or by a sputtering process (where surface molecules are emitted from a cathode when the cathode is bombarded with positive ions from a rare gas discharge and the emitted surface molecules collide with and bond to a nearby substrate). Pursuant to the present invention, silicon layers of from about 150 nm to about 500 nm thickness have been deposited on glass substrates under atmospheric conditions that can be expected to generate an outer surface layer of silicon dioxide, such as an about 20 μm (2.0 nm) layer. In one embodiment, the outer silicon dioxide layer is from about 15 μm (1.5 nm) to about 30 μm (3.0 nm) in thickness. The coated nonconductive substrate is treated, as needed, to create channels, reservoirs, or reaction cells using etching or laser ablation techniques. Alternatively, such microstructures can be formed in the nonconductive substrate prior to coating with the field-assist bonding material. The coated substrate is then positioned against a glass substrate with a shape that conforms to the shape of the coated, nonconductive substrate. The glass substrate preferably is not coated with the field-assist bonding material on the surface that will be bonded. The two substrates are placed in a field-assisted bonding device 700 such as that illustrated in FIG. 1. The field-assisted bonding device 700 has a heating device 710, such as a heating plate or furnace. The field-assisted bonding device 700 further has an electrode 720 and a ground 730 that allows a voltage to be applied across the glass substrate 740 and the nonconductive substrate 750, to which has been applied a layer of silicon 760. Arrows 770 indicate the electric field orientation. Generally, the field-assisted bonding is conducted under a normal atmosphere. It will be recognized that microstructures can alternatively or additionally be formed on the glass substrate. These microstructures preferably include channels of capillary dimensions, such as channels having widths from about 50 μm to about 400 μm and depths from about 100 μm to about 250 μm.

In a preferred embodiment of the invention, the density of etched or otherwise formed cavities in the surfaces to be joined is low enough that at least about 40% of the matched surface area can be expected to be bonded, more preferably at least about 50%.

The two substrates are brought to a temperature effective to bond the two substrates together when an appropriate electric field is applied across the plates effective to accelerate the bonding process. While not wishing to be bound by theory, it is believed that the combination of (1) an electrode 720 applied to the glass substrate 740 and (2) the greater exchange-site mobility of ions (such as sodium ions) caused by the elevated temperature causes an ion depletion (such as a sodium ion depletion) on the face of the glass substrate 740 opposite that to which the cathode is applied. The ion depletion, it is believed, causes a surface charge at the bottom surface of glass substrate 740, which correlates with the creation of a strong localized electrostatic attraction for the nonconductive substrate 750. It is clear that this process creates strong bonding between the substrates and, it is believed that this is due to the formation of chemical bonds between the silica of the glass substrate 740 and the silicon coated onto the nonconductive substrate 750. Preferably, the electrode 720 is a cathode. Preferably, the temperature is brought to from about 200° C. to about 600° C., more preferably from about 300° C. to about 450° C. Alternatively, the temperature is brought to no more than about 50° C. less than the annealing temperature of the glass being handled (preferably from about 200° C. to about 50° C. less), more preferably to no more than about 100° C. less than the annealing temperature (preferably from about 200° C. to about 100° C. less), yet more preferably to no more than about 150° C. less than the annealing temperature (preferably from about 200° C. to about 150° C. less). During the process an voltage typically from about 200 V to about 2,500 V, preferably from about 500 V to about 1,500 V, is applied across the first glass substrate 740 and second glass substrate 750. The voltage most suitably applied varies with the thickness of the substrates. The voltage pulls the glass substrate 740 and nonconductive substrate 750, including the silicon layer 760 applied to one of the substrates, into intimate contact. Typically, hermetic sealing is achieved within minutes to about one hour, depending on the planar dimensions of the glass substrates. The time required to achieve adequate sealing varies with, among other things, the smoothness of the substrates, the conformity of the surfaces of the glass substrates to be bonded, the electrical field strength, the temperature, and the dimensions of the substrates. Bonding between the substrates is typically apparent visually, since it is accompanied by the disappearance of the optical interface pattern (e.g. rainbow pattern) created at the junction between the substrates and the formation of gray color at the bonded regions that can be seen when an observer looks through the two substrates.

Corning 1735 boroaluminosilicate glass, and Corning 7740 borosilicate glass (Pyrex™, annealing temperature= 560° C.), available from Corning Glass Co., Corning, N.Y., are among the preferred glasses for use in this invention. Other glasses, including soda lime glass, are suitable.

Substrates, preferably plates, having a thickness of from about 0.1 to about 5 mm, more preferably from about 0.2 mm to about 5 mm, yet preferably from about 0.5 mm to about 2 mm are particularly suitable. Preferred silicon materials for use as the field-assist bonding material are pure, non-doped, densely packed and have amorphous structure. The nonconductive substrate is preferably glass or aluminum oxide. More preferably, the nonconductive substrate is glass, particularly a glass with an annealing temperature of at least about 520° C.

In a preferred embodiment, at least 3 substrates are bonded together by the method of the invention. This is done either (a) by bonding two substrates together, followed by bonding the third or (b) by simultaneously bonding the three substrates together. In another embodiment, at least four substrates are bonded. This is done either (a) by twice separately bonding two substrates together, followed by bonding the two two-substrate pieces together or (b) by bonding a three-substrate piece to a fourth substrate.

The method of the invention can be used to bond a glass substrate to another glass substrate and to a nonconductive substrate simultaneously. In a preferred embodiment, the invention is used to simultaneously bond three glass substrates.

Those of ordinary skill will recognize that while a hot plate is illustrated as providing the heating for the thermal assisted bonding, other heating devices, including ovens, may be used. It will also be realized that it is desirable to match, when possible, the coefficients of thermal expansion of the substrates to be bonded.

Other features of liquid distribution systems are described in an application filed Nov. 9, 1995 entitled, "Liquid Distribution System," U.S. application Ser. No. 08/556,036, which application is a continuation-in-part of U.S. application Ser. No. 08/338,703, titled "A Partitioned Microelectronic and Fluidic Device Array for Clinical Diagnostics and Chemical Synthesis," filed Nov. 10, 1994, a continuation-in-part of U.S. application Ser. No. 08/469,238, titled "Apparatus and Methods for Controlling Fluid Flow in Microchannels," filed Jun. 6, 1995 and a continuation-in-part of U.S. application Ser. No. 08/483,331, titled "Method and System for Inhibiting Cross-Contamination in Fluids of Combinatorial Chemistry Device," filed Jun. 7, 1995. The disclosure of this Nov. 9, 1995 application entitled "Liquid Distribution System" is incorporated herein by reference in its entirety.

B. Liquid Distribution System

Figure 2:
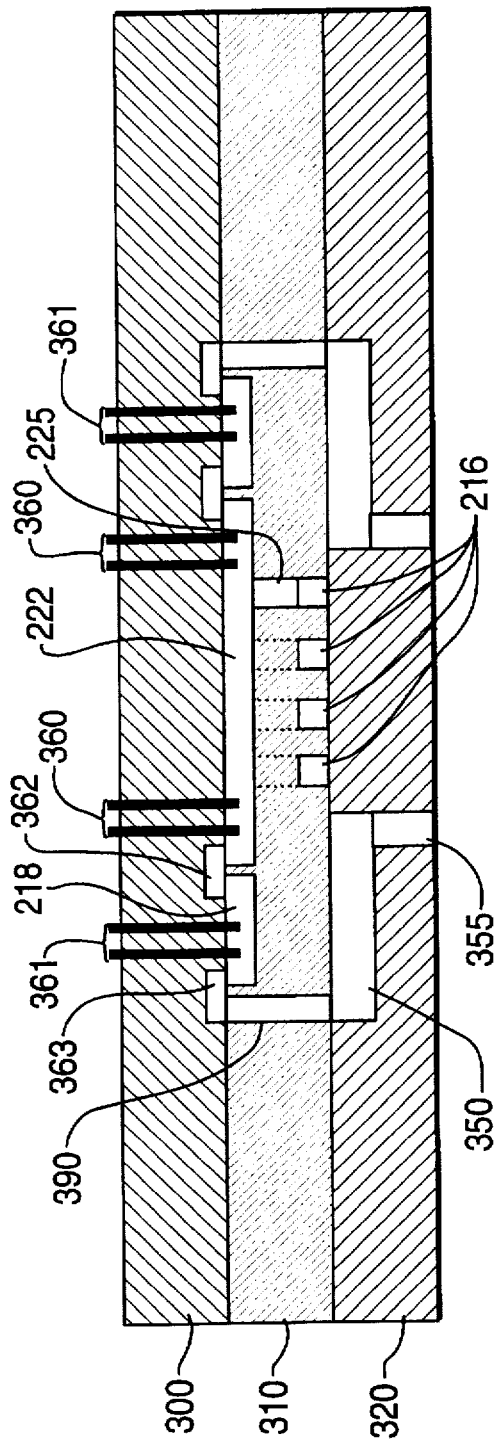
FIG. 2 displays a cut-away view of a liquid distribution system.
Figure 3:
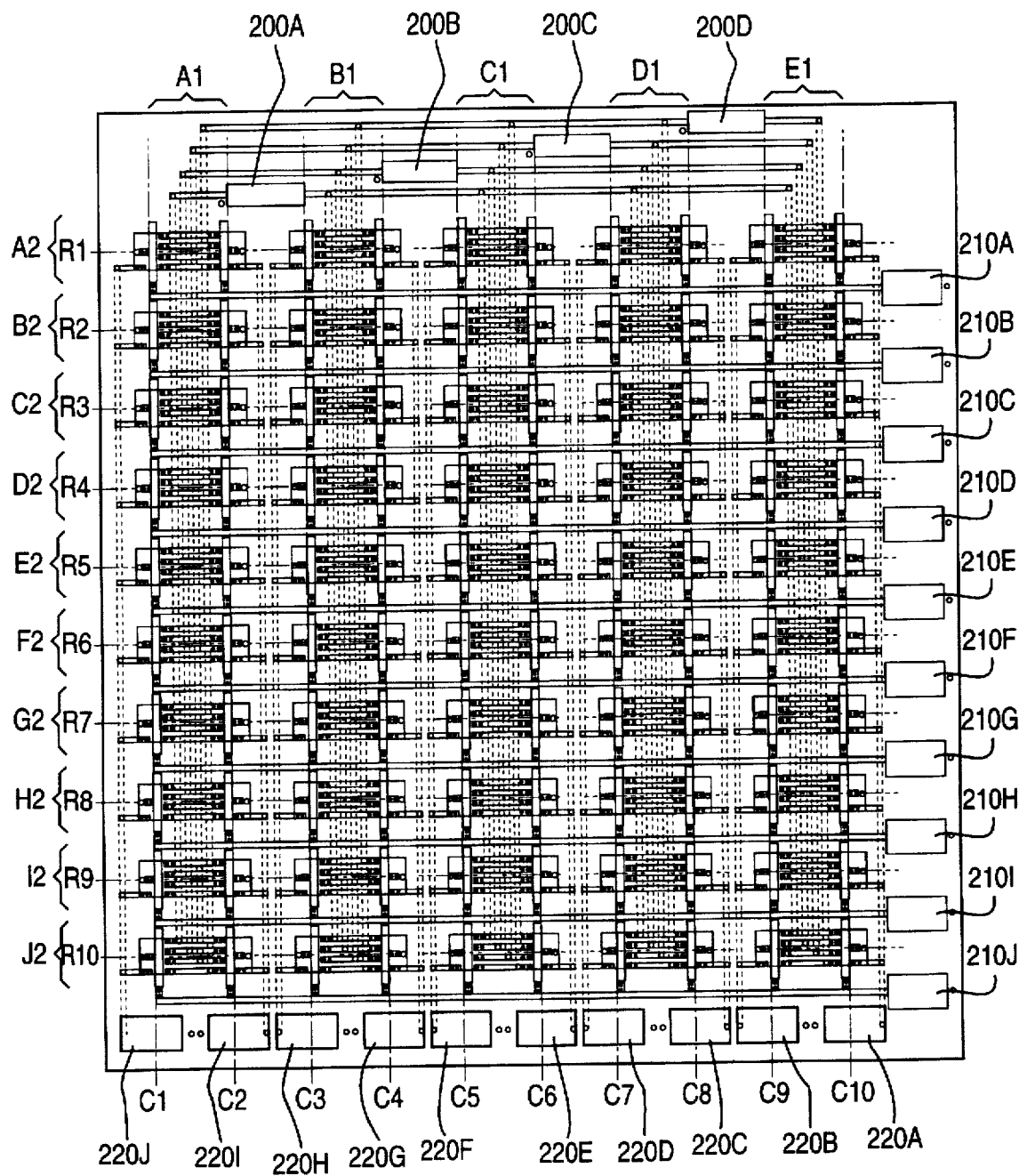
FIG. 3 displays a distribution plate of the liquid distribution system of FIG. 2.
Figure 4:
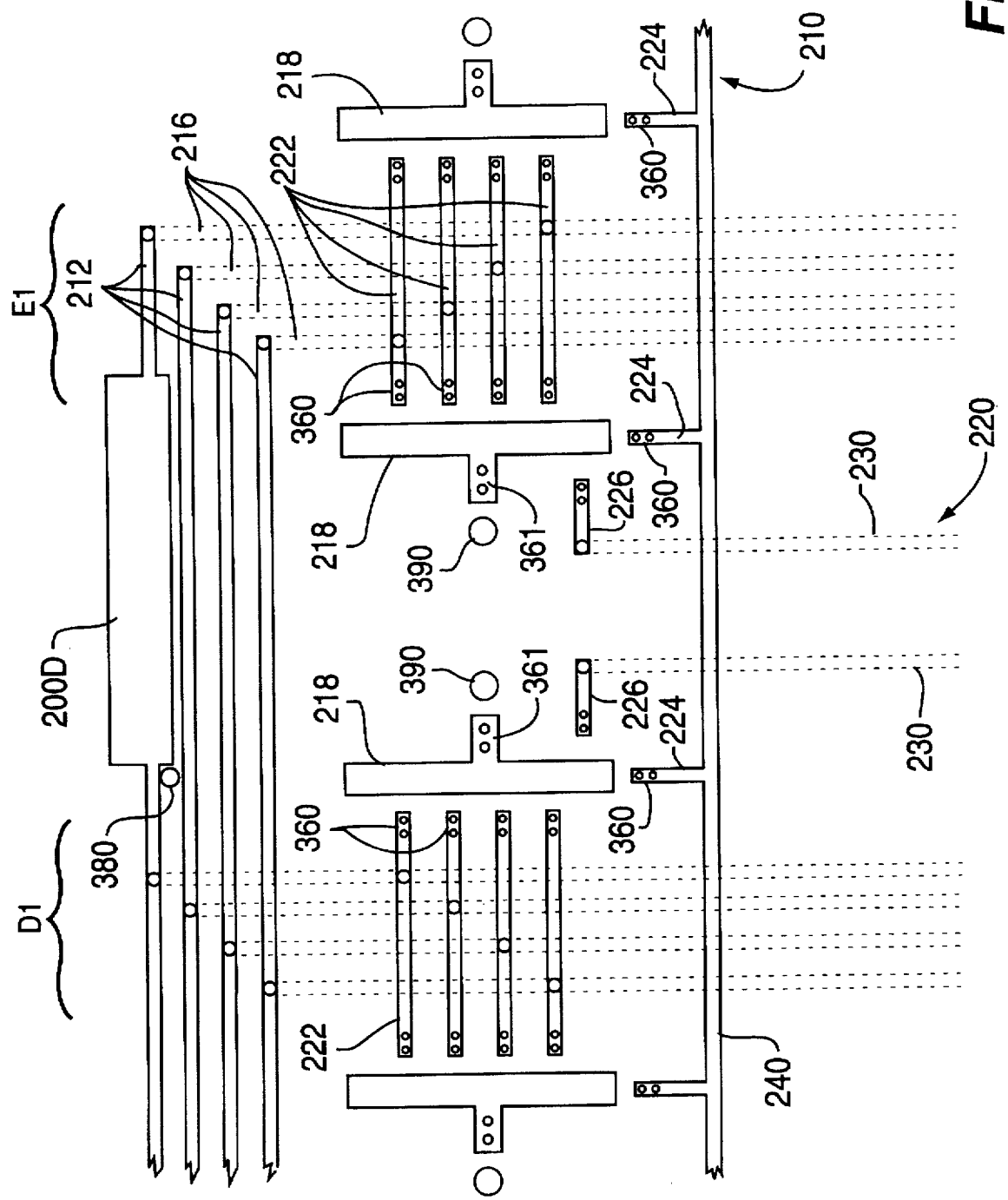
FIG. 4 displays an expanded view of a portion of the distribution plate of FIG. 3.

One version of the liquid distribution system 100 that gave rise to the invention is illustrated in FIGS. 2–4. The distribution system is formed of at least three plates, a feedthrough plate 300, a distribution plate 310 and a reaction cell plate 320 (FIG. 2). The feedthrough plate 300 is bonded to the distribution plate 310 using the method of the invention. The feedthrough plate 300 has multiple first electrodes 360 and second electrodes 361. The reaction cell plate 320 is typically removably fitted to the underside of the distribution plate 310, or the underside of intermediate plate 330 interposed between the distribution plate 310 and the reaction cell plate 320.

FIG. 3 shows the layout of a distribution plate 310 according to the invention. FIG. 4 shows an expanded view of a portion of a distribution plate 310 that better illustrates some of the features obscured by the scale of FIG. 4. Typically, the structures indicated in solid lines will be formed in the top layer of the distribution plate 310, while the structures indicated with dotted lines will be formed in the bottom layer of the distribution plate 310, except that in FIG. 2 the reaction cells 350 are indicated by boxes in solid lines even though these structures are located in a lower plane Where appropriate, vertical channels connect the structures in the top of the distribution plate 310 with those in the bottom.

At the top of FIG. 3 are four first fluid reservoirs 200A, 200B, 200C and 200D, each having a defined fill level. Each of these first fluid reservoirs 200A, 200B, 200C and 200D has two first reservoir extensions 212 extending along substantially all of an EW axis (see definitions) of the distribution plate 310. The ceilings of the first reservoir extensions 212 preferably are at substantially the same elevation as the first fill level. At five staggered locations, A1, B1, C1, D1, and E1, along the EW axis of the first reservoir extensions 212 there are four first vertical channels 214 (not shown) that connect the first reservoir extensions 212 with four first horizontal feeder channel segments 216 that are formed in the bottom layer of the distribution plate 310. At each staggered location A1, B1, C1, D1 or E1, four adjacent first horizontal feeder channel segments 216, which are connected to separate first reservoir extensions 212, extend along an NS axis to ten positions, A2, B2, C2, D2, E2, F2, G2, H2, I2 and J2. Each position A2, B2, C2, D2, E2, F2, G2, I2 or J2 along the course of each such set of four adjacent horizontal feeder channel segments 216 is adjacent to a pair of reaction cells 350 (not shown). At these positions A2, B2, C2, D2, E2, F2, G2, H2, I2, or J2, the four adjacent first horizontal feeder channel segments 216 are separately connected, via separate second vertical channels 225 (not shown), to each of four perpendicular first distribution channels 222 formed in the top layer of the distribution plate 310. The ceilings of the first distribution channels 222 define a second fill level that is typically substantially the elevation of the first fill level. The fill level of a distribution channel (e.g., the second fill level) is "substantially" the fill level of the connected reservoir (e.g., the first fill level) if they are offset vertically by no more than about 10% of the depth of the channel; even if the fill levels are further offset vertically they are still substantially the same if filling the reservoir to its fill level results in filling the connected distribution channel and the retention of fluid in the connected distribution channel. The combination of a first vertical channel 214, connected to a horizontal feeder channel segment 216, in turn connected to a second vertical channel 225 makes up a first feeder channel 217 (not identified in the Figures).

If liquids are maintained at a defined first level in a first fluid reservoir 200, then substantially the same level will be maintained in the first distribution channels 222 connected to that first fluid reservoir 200 via first feeder channels 217. This equalization occurs due to the principle that two connected bodies of liquid will tend to seek the same level and, where the size of the channels allows, due to capillary flow. Liquids are maintained at defined level in the first fluid reservoirs. In the illustrated embodiment, liquid is fed into the fluid reservoir 200 through channels in the feedthrough plate 300 and such liquid that is not needed to fill the fluid reservoirs to the defined level is drained through drains 380. First openings 381 (not shown) are formed in the bottom layer of the feedthrough plate 300 to create a liquid connection or sluice between the first fluid reservoirs 200 and the drains 380. Liquids are constantly feed into the first fluid reservoirs 200 (as well as the second fluid reservoirs 210 and third fluid reservoirs 220) typically by the use of an external pump 15 (not shown), such as the model number 205U multichannel cassette pump available from Watson-Marlow, Inc. Alternatively, a defined level can be maintained by monitoring the level of liquid in the first fluid reservoirs 200 (or second fluid reservoirs 210 or third fluid reservoirs 220) and only activating the pumps feeding liquid to a given fluid reservoir when needed to maintain the defined level.

Each set of four adjacent first distribution channels 222 are adjacent to two buffer channels 218, located to each side of the first distribution channels 222 along the EW axis. Liquid can be pumped from any first distribution channel 222 into the adjacent buffer channel 218 by activating the first pump 360 (indicated in FIG. 4 by two filled dots representing the electrodes of one type of pump, termed an "electrokinetic" pump since it moves fluid through the application of a potential across the electrodes) of the first distribution channel 222. This pumping creates additional pressure that moves the liquid over capillary barrier 370 (not shown) separating the first distribution channel 222 and the buffer channel 218. Between each first distribution channel 222, second distribution channel 224 or third distribution channel 226 and the adjacent buffer channel 218 and between each buffer channel 218 and its adjacent third vertical channel 390 (described below) there is such a capillary barrier 370 that inhibits liquid flow when the pumps are not activated. Second openings 362 (not shown) are formed in the bottom layer of the feedthrough plate 300 to create a liquid connection or sluice between the first distribution channels 222 and the buffer channels 218. From a buffer channel 218, liquid can be pumped using a second pump 361 (indicated in FIG. 4 by two filled dots representing the electrodes of one type of pump) to a third vertical channel 390 that connects with a reaction cell in the reaction cell plate 320. Third openings 363 (not shown) in the bottom layer of the feedthrough plate 300 or the distribution plate 310 serve to create a liquid connection or sluice between the buffer channels 218 and third vertical channels 390.

Other features are described in an application filed Nov. 9, 1995 entitled, "Liquid Distribution System," U.S. application Ser. No. 08/556,036, which application is a continuation-in-part of U.S. application Ser. No. 08/338, 703, titled "A Partitioned Microelectronic and Fluidic Device Array for Clinical Diagnostics and Chemical Synthesis," filed Nov. 10, 1994, a continuation-in-part of U.S. application Ser. No. 08/469,238, titled "Apparatus and Methods for Controlling Fluid Flow in Microchannels," filed Jun. 6, 1995 and a continuation-in-part of U.S. application Ser. No. 08/483,331, titled "Method and System for Inhibiting Cross-Contamination in Fluids of Combinatorial Chemistry Device," filed Jun. 7, 1995. The disclosure of this Nov. 9, 1995 application entitled "Liquid Distribution System" and of all the above-recited priority filings named in the Nov. 9, 1995 application are incorporated herein by reference in their entirety.

EXAMPLE 1

Two Corning 7740 glass plates (2'×2') were first lapped and polished to the thickness of 0.5 mm. One plate was used as a bottom plate, while another was used as a top plate. The bottom plate was processed through the microfabrication techniques, so that a designed layout of channels and cavities was etched on it. The bottom plate was then coated with a layer of silicon (200 nm) using chemical vapor deposition process. The top plate was drilled by the laser ablation to obtain a hole pattern, which pattern created conduits for electrodes that could be projected into the channels to create electrokinetic pumps. After cleaning, the two plates were assembled so that the top plate was above the bottom plate. The hole pattern in the top plate was properly aligned with the channel layout in the bottom plate. After the assembly was placed on the hot plate (see FIG. 1), a metal electrode firmly touched the top plate while the bottom plate was grounded. The hot plate was then activated. After the temperature of the plates reached 375° C., a voltage of 1500 V was applied across the two plates and the bonding started. The disappearance of the interference pattern between two plates indicated that the bonding process was complete. The plates were slowly cooled down to the room temperature all of the interface area, except that occupied by channels and cavities, was bonded.

Thus, the invention provides a method of bonding a glass substrate and a nonconductive substrate comprising the steps of: (a) uniformly coating a surface of the nonconductive substrate with a field-assist bonding material; (b) contacting the coated surface with a conforming surface of the glass substrate; (c) heating the two substrates to a temperature no more than about 50° C. below the lowest annealing temperature of the two substrates; and (d) applying a voltage across the two substrates that is effective to accelerate the formation of the bond between the two substrates. The phrase "uniformly coating" means that the coating is applied to substantially all of the surface intended to be bonded, without applying a pattern to the coating.

The method of the invention provides a process of completing a preserving liquid-handling structures of capillary dimensions, which liquid-handling structures are formed in a one of the surfaces to be bonded, the method acting to enclose the liquid-handling structures by bonding the two surfaces.

The invention further provides a method of completing and preserving liquid-handling structures of capillary dimensions, which liquid-handling structures are formed in a surface of a glass substrate or of a nonconductive substrate, the method acting to enclose the liquid-handling structures by bonding the glass surface to the surface of a nonconductive substrate, the method comprising the steps of (a) contacting (1) a the surface of the nonconductive substrate which is coated with a field-assist bonding material with (2) the other surface that is to be bonded; and (b) applying sufficient heat to the two substrates and sufficient voltage across the two substrates to bond the two substrates together, wherein the voltage applied is effective to accelerate the bonding process.

While this invention has been described with an emphasis upon preferred embodiments, it will be obvious to those of ordinary skill in the art that variations in the preferred devices and methods may be used and that it is intended that the invention may be practiced otherwise than as specifically described herein. Accordingly, this invention includes all modifications encompassed within the spirit and scope of the invention as defined by the claims that follow.

We claim:

1. A method of bonding a glass substrate and a nonconductive substrate, wherein each substrate has a thickness of at least about 0.1 mm, comprising the steps of: (a) uniformly coating a surface of the nonconductive substrate with a field-assist bonding material; (b) contacting the coated surface with a conforming surface of the glass substrate; (c) heating the two substrates to a temperature no more than about 100° C. below the lowest annealing temperature of the two substrates; and (d) applying a voltage across the two substrates that is effective to accelerate the formation of the bond between the two substrates.

2. The method of claim 1, wherein a hermetic seal is formed between the two substrates.

3. The method of claim 1, wherein the voltage and heat applied are effective to create a negative surface charge at the conforming surface of the nonconductive substrate.

4. The method of claim 1, wherein the coating of field-assist bonding material is from about 50 nm to about 1,000 nm in thickness.

5. The method of claim 4, wherein the coating of field-assist bonding material is from about 150 nm to about 500 nm in thickness.

6. The method of claim 1, wherein the field-assist bonding material is silicon.

7. The method of claim 1, wherein the two substrates are both from about 0.1 mm to about 5 mm in thickness.

8. The method of claim 1, wherein the heat applied heats the plates to from about 200° C. to about 600° C.

9. The method of claim 8, wherein the heat applied heats the plates to from about 300° C. to about 450° C.

10. The method of claim 1, wherein the heat applied heats the two substrates to no more than about 150° C. less than the lowest annealing temperature of the substrates being bonded.

11. A method of bonding a glass substrate and a nonconductive substrate, wherein each substrate has a thickness of at least about 0.1 mm, comprising the steps of: (a) uniformly coating a surface of the nonconductive substrate with silicon; (b) contacting the coated surface with a conforming surface of the glass substrate; (c) heating the two substrates to a temperature no more than about 50° C. below the lowest annealing temperature of the two substrates; and (d) applying a voltage across the two substrates that is effective to accelerate the formation of the bond between the two substrates.

12. The method of claim 11, wherein the nonconductive substrate is glass.

13. The method of claim 12, wherein the heat applied heats the glass substrates to no more than about 100° C. less than the lowest annealing temperature of the substrates being bonded.

14. The method of claim 12, wherein the heat applied heats the glass substrates to no more than about 150° C. less than the lowest annealing temperature of the substrates being bonded.

15. The method of claim 1, wherein the nonconductive substrate is glass.

16. The method of claim 15, wherein both substrates are glass having an annealing temperature of about 520° C. or more.

17. The method of claim 1, wherein the method provides a process of completing a preserving liquid-handling structures of capillary dimensions, which liquid-handling structures are formed in one of the surfaces to be bonded, the method acting to enclose the liquid-handling structures by bonding the two surfaces.

18. A method of completing and preserving liquid-handling structures of capillary dimensions, which liquid-handling structures are formed in a surface of a glass substrate or of a nonconductive substrate, the method acting to enclose the liquid-handling structures by bonding the glass surface to a surface of a nonconductive substrate, the method comprising the steps of:

(a) contacting (1) the surface of the nonconductive substrate, which is coated with a field-assist bonding material, with (2) the glass surface that is to be bonded; and (b) applying sufficient heat to the two substrates and sufficient voltage across the two substrates to bond the two substrates together, wherein the voltage applied is effective to accelerate the bonding process.

19. A glass structure formed of a first glass substrate and a second glass substrate hermetically bonded together, each glass substrate having a thickness of at least about 0.1 mm, wherein there is a uniformly applied layer of silicon interposed between the glass substrates.

20. The glass structure of claim 19, wherein the layer of silicon is from about 50 nm to about 400 nm in thickness.

21. The glass structure of claim 19, wherein at least one of the glass substrates has liquid-handling structures formed on a surface thereof and the hermetically sealed second glass substrate acts to enclose the liquid-handling structures.

22. The glass structure of claim 19, comprising a third glass substrate hermetically bonded to the second glass substrate and a fourth glass substrate hermetically bonded to the third glass substrate.

* * * * *